(12) United States Patent
Jeong et al.

(10) Patent No.: US 10,818,365 B2
(45) Date of Patent: Oct. 27, 2020

(54) MEMORY SYSTEM AND OPERATING METHOD THEREOF

(71) Applicant: SK hynix Inc., Gyeonggi-do (KR)

(72) Inventors: Seung-Gyu Jeong, Gyeonggi-do (KR);
Jung-Hyun Kwon, Seoul (KR);
Do-Sun Hong, Gyeonggi-do (KR);
Won-Gyu Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 104 days.

(21) Appl. No.: 16/124,927

(22) Filed: Sep. 7, 2018

(65) Prior Publication Data

US 2019/0237150 A1    Aug. 1, 2019

(30) Foreign Application Priority Data

Feb. 1, 2018    (KR) .................. 10-2018-0012744

(51) Int. Cl.
| | | |
|---|---|---|
| *G11C 11/34* | (2006.01) |
| *G11C 16/04* | (2006.01) |
| *G11C 16/34* | (2006.01) |
| *G11C 16/32* | (2006.01) |
| *G11C 16/26* | (2006.01) |
| *G11C 16/10* | (2006.01) |

(52) U.S. Cl.
CPC ........ *G11C 16/3427* (2013.01); *G11C 16/107* (2013.01); *G11C 16/26* (2013.01); *G11C 16/32* (2013.01); *G11C 16/349* (2013.01)

(58) Field of Classification Search
CPC ... G11C 16/3427; G11C 16/107; G11C 16/26; G11C 16/32; G11C 16/349
See application file for complete search history.

(56) References Cited

U.S. PATENT DOCUMENTS

| 8,108,592 | B2 * | 1/2012 | Kim ................... G06F 12/0246 |
| | | | 711/103 |
| 9,349,479 | B1 | 5/2016 | Sehgal et al. |
| 2011/0246701 | A1 * | 10/2011 | Kano ................. G06F 12/0246 |
| | | | 711/103 |
| 2011/0264843 | A1 * | 10/2011 | Haines ................. G06F 3/0629 |
| | | | 711/103 |
| 2017/0344278 | A1 * | 11/2017 | Hong ................. G11C 13/0033 |
| 2018/0113620 | A1 * | 4/2018 | Kwon .................. G06F 3/0604 |
| 2018/0113636 | A1 * | 4/2018 | Kwon ............... G06F 12/0246 |
| 2018/0157427 | A1 * | 6/2018 | Hong ................. G06F 12/0246 |

FOREIGN PATENT DOCUMENTS

KR    1020130061967    6/2013

* cited by examiner

*Primary Examiner* — Toan K Le
(74) *Attorney, Agent, or Firm* — IP & T Group LLP

(57) ABSTRACT

A memory system includes a memory device including a plurality of memory blocks, a first detection block suitable for detecting a hot memory block based on a number of times that a write operation is performed among the memory blocks during the write operation, a second detection block suitable for detecting first memory blocks based on the number of times that the write operation is performed among the memory blocks and detecting a cold memory block based on addresses of the first memory blocks, when the hot memory block is detected, and a wear-leveling block suitable for swapping data of the hot memory block for data of the cold memory block.

20 Claims, 6 Drawing Sheets

MEMORY SYSTEM AND OPERATING METHOD THEREOF

CROSS-REFERENCE TO RELATED APPLICATIONS

This application claims priority under 35 U.S.C. § 119(a) to Korean Patent Application No. 10-2018-0012744, filed on Feb. 1, 2018, which is incorporated herein by reference in its entirety.

BACKGROUND

1. Field

Various exemplary embodiments of the present invention relate to a memory system including a memory device, and more particularly, to a memory system capable of reducing a read disturbance phenomenon of a memory device, and an operation method thereof.

2. Description of the Related Art

A memory device is chiefly classified as a volatile memory device or a nonvolatile memory device.

A volatile memory device has high write and read speeds, but loses data stored therein when power is turned off. Examples of a volatile memory device include a dynamic random access memory (DRAM), a static RAM (SRAM), etc. On the other hand, a nonvolatile memory device has comparatively low write and read speeds, but retains data stored therein even when power is cut off. Therefore, a nonvolatile memory device is used when there is a need for storing data which should be retained regardless of the status of the power supply. Representative examples of a nonvolatile memory device include a read only memory (ROM), a mask ROM (MROM), a programmable ROM (PROM), an erasable programmable ROM (EPROM), an electrically erasable programmable ROM (EEPROM), a flash memory, a phase change random access memory (PCRAM), a magnetic RAM (MRAM), a resistive RAM (RRAM), a ferro-electric RAM (FRAM), etc. A flash memory device is chiefly classified into a NOR-type memory device and a NAND-type memory device.

Among the nonvolatile memory devices, the PCRAM has a limited write endurance. The write endurance may be defined as the number of write (i.e., program) cycles that can be applied to a memory block before storage media lose their reliability. The write endurance may be calculated by estimating how often the memory is used and how much the entire memory is used.

Therefore, when write operations are concentrated on a specific memory cell region, the lifetime of the memory device may be rapidly reduced. In order to prevent the concentration of write operations on a specific memory cell region, the memory device performs a wear-leveling operation such that the write operations can be evenly performed in the whole memory cell regions of the memory device. The wear-leveling operation is used to extend the write endurance of storage media. This technique is to evenly select memory cell regions as target regions of write operations to the storage media. Thus, while the repeated use of a specific memory cell region in the storage media is reduced, all the memory cell regions can be evenly used.

Meanwhile, because of the continuous increase in the degree of integration of memory devices, the distance between adjacent memory cells in the memory device is reduced, which may result in malfunction due to an increase of a coupling effect between the adjacent memory cells. For example, when read operations are repeatedly performed on a specific memory cell of the memory device, stress is accumulated in adjacent memory cells, whereby a read disturbance phenomenon may occur and data stored therein may be corrupted.

SUMMARY

Various embodiments of the present invention are directed to a memory system capable of checking a read operation of a memory device and reducing read disturbance occurring in a region of the memory device, and an operating method of the memory system.

In accordance with an embodiment of the present invention, a memory system includes: a memory device including a plurality of memory blocks; a first detection block suitable for detecting a hot memory block based on a number of times that a write operation is performed among the memory blocks during the write operation; a second detection block suitable for detecting first memory blocks based on the number of times that the write operation is performed among the memory blocks and detecting a cold memory block based on addresses of the first memory blocks, when the hot memory block is detected; and a wear-leveling block suitable for swapping data of the hot memory block for data of the cold memory block.

In accordance with an embodiment of the present invention, an operating method for a memory system includes: detecting a hot memory block based on a number of times that a write operation is performed among a plurality of memory blocks during the write operation; detecting first memory blocks based on the number of times that the write operation is performed among the memory blocks when the hot memory blocks is detected; detecting a cold memory block based on addresses of the first memory blocks; and swapping data of the hot memory block for data of the cold memory block.

In accordance with an embodiment of the present invention, an operating method for a memory system includes: checking a number of times that a read operation is performed on a plurality of memory blocks; detecting memory blocks on which the number of times that the read operation is performed is smaller than a second threshold value among the plurality of memory blocks; detecting a memory block, among the detected memory blocks, having an address different from addresses of designated memory blocks among the plurality of memory blocks as a second memory block; detecting a memory block on which the number of times that the read operation is performed is equal to or greater than a third threshold value among the designated memory blocks as a third memory block; and swapping data of the second memory block for data of the third memory block.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details.

The drawings are not necessarily to scale and, in some instances, proportions may have been exaggerated in order to clearly illustrate features of the embodiments.

Figure 1:
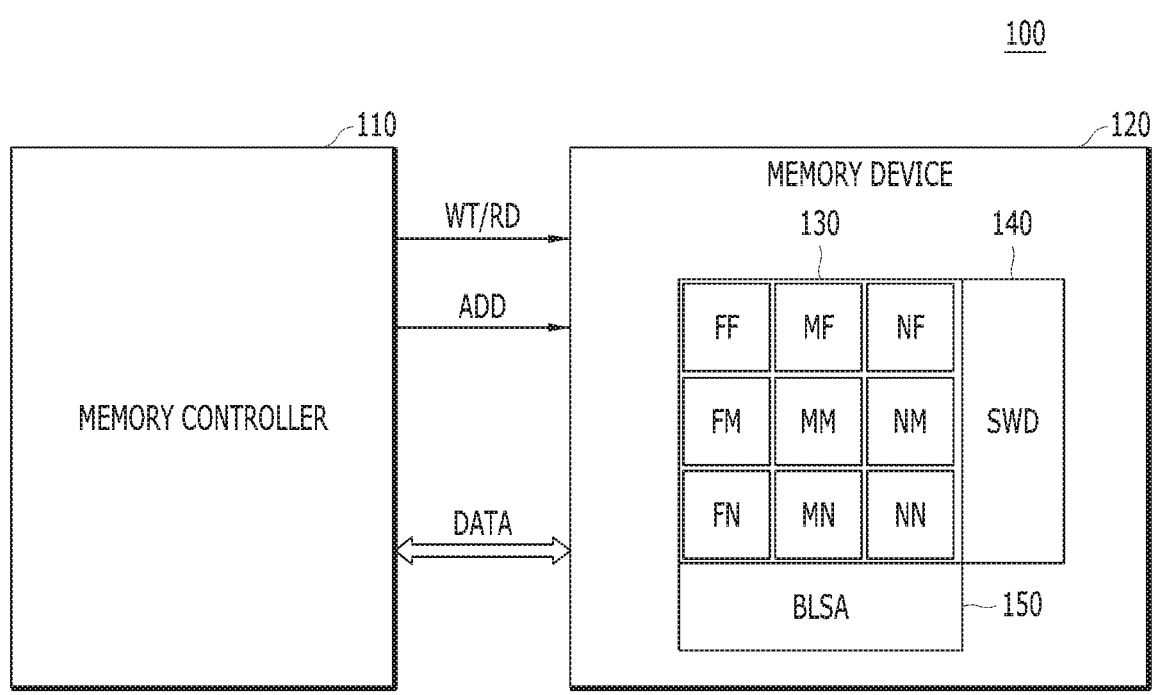
FIG. 1 is a block diagram illustrating a memory system in accordance with an embodiment of the present invention.

FIG. 1 is a block diagram illustrating a memory system 100 in accordance with an embodiment of the present invention. Referring to FIG. 1, the memory system 100 may include a memory controller 110, and a memory device 120.

The memory controller 110 may control an operation of the memory device 120 in response to a request of a host (not illustrated). For example, the memory controller 110 may store data DATA provided from the host in the memory device 120, and provide the data DATA read from the memory device 120 to the host. To this end, the memory controller 110 may generate write/read commands WT/RD and an address ADD to control write and read operations of the memory device 120.

In addition, the memory controller 110 may control various kinds of background operations of the memory device 120. The memory controller 110 may perform a wear-leveling operation such that the write operation may be evenly performed in whole memory cell regions of the memory device 120. The memory controller 110 may prevent data of memory cells of the memory device 120 from being damaged because of read disturbance caused by the read operation. Such an operation of the memory controller 110 will be described in detail with reference to FIG. 2.

The memory device 120 may include a phase change random access memory (PCRAM). However, the present invention is not limited thereto, and the memory device 120 may include a nonvolatile memory device such as a magnetic RAM (MRAM), a resistive RAM (RRAM), a ferroelectric RAM (FRAM) and a flash memory. FIG. shows a configuration related to the present invention, that is, a memory cell region, among various configurations of the memory device 120.

The memory device 120 may include memory cells (not illustrated) that are arranged in a form of a matrix. The memory cells may be coupled to a plurality of word lines and a plurality of bit lines. A memory cell array 130 where the memory cells are regularly arranged may be formed in the memory cell region of the memory device 120. A sub word line driver region (SWD) 140 and a bit line sense amplifying region (BLSA) 150 may be positioned corresponding to the memory cell array 130. The SWD 140 may drive word lines coupled to the memory cells, and the BLSA 150 may sense and amplify data of bit lines coupled to the memory cells. FIG. representatively illustrates a single memory cell array 130 on behalf of a plurality of memory cell arrays included in the memory device 120.

The memory cells included in the memory cell array 130 may be coupled in a hierarchical manner to a plurality of main word lines and a plurality of sub word lines coupled to each of the main word lines. A plurality of drivers for driving a specific word line in response to a main word line driving signal and a local word line driving signal may be positioned in the SWD 140.

Data of memory cells coupled to the driven word line may be sensed and amplified through the bit lines by a plurality of sense amplifiers positioned in the BLSA 150. The sense amplifiers may drive the bit lines depending on data and store the data in the memory cells.

The memory cell array 130 may include a plurality of memory blocks. As shown in FIG. 1, the memory blocks may be divided based on a distance from the memory cell array 130, the SWD 140 and the BLSA 150 depending on a disposition thereof.

For example, the memory blocks may be divided into memory blocks positioned nearest to the SWD 140 and the BLSA 150, which are denoted by "N", memory blocks positioned farthest from the SWD 140 and the BLSA 150, which are denoted by "F", and memory blocks positioned therebetween, which are denoted by "M". This is merely an example in accordance with an embodiment of the present invention, and the memory blocks may be divided by further refining or simplifying the distance from the respective regions.

The memory blocks positioned adjacent to the SWD 140 and the BLSA 150 may be affected by an operation of the driver or the sense amplifier included in each of the regions. That is, the data of the memory cells included in the memory blocks may be affected by the operation of the driver or the sense amplifier. Particularly, when the read operation is performed on a memory block NN adjacent to both of the SWD 140 and the BLSA 150, the probability of occurrence of a bit error in data may be higher than a memory block FF farthest from the SWD 140 and the BLSA 150. Accordingly, when the read operation is frequently performed on the memory block NN, the number of error correction code (ECC) operations or scrubbing operations may also increase due to the bit error occurring in the data which is read. It may be necessary to rearrange the memory blocks based on the read operation performed on the memory blocks.

Figure 2:
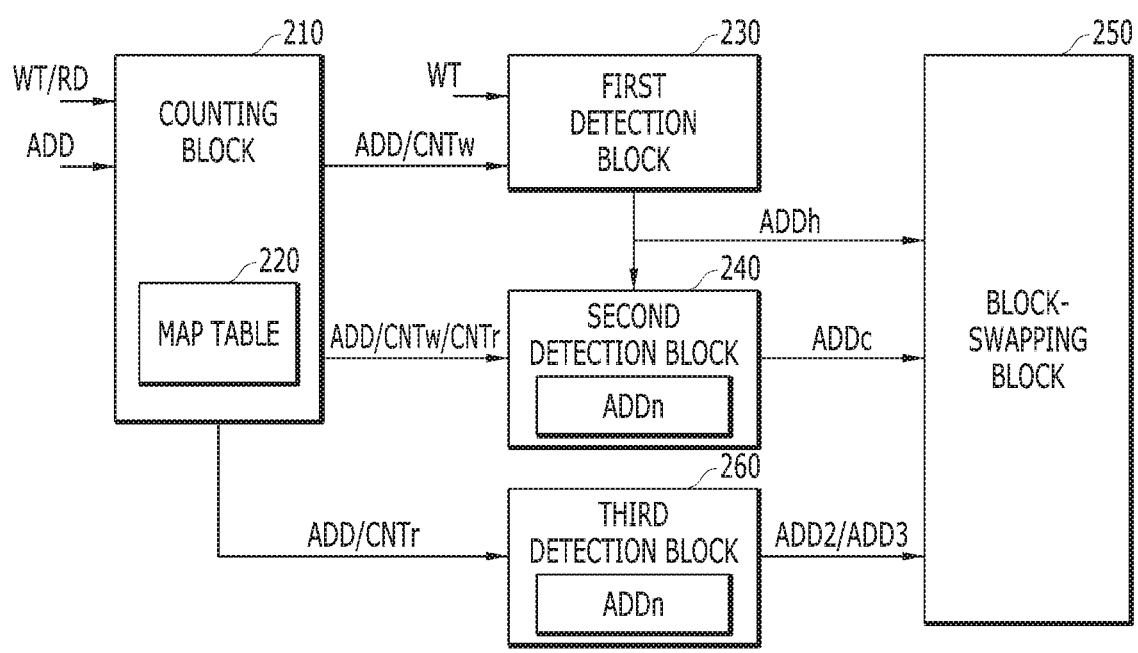
FIG. 2 is a block diagram illustrating the memory controller shown in FIG. 1.

FIG. 2 is a block diagram illustrating the memory controller 110 shown in FIG. 1. Referring to FIG. 2, the memory controller 110 may include a counting block 210, a first detection block 230, a second detection block 240, and a block-swapping block 250. The counting block 210, the first detection block 230, the second detection block 240, and the block-swapping block 250 may include all circuits, systems, software, firmware and devices necessary for their respective operations and functions.

In accordance with an embodiment of the present invention, the counting block 210 may count the write operation performed on the memory device 120. When the write operation and the read operation are proportionately performed on the memory blocks included in the memory device 120, the counting block 210 may count just the write operation so as to reduce an operational load.

The counting block 210 may perform a counting operation in response to the write command WT. The counting block 210 may receive the address ADD indicating a memory block on which the write operation is performed. In response to the write command WT, the counting block 210 may increase a write count value CNTw of the address ADD corresponding to the memory block on which the write operation is performed. Accordingly, the counting block 210 may generate the write count value CNTw indicating a number of times that the write operation is performed on the memory blocks. The counting block 210 may include a map table 220, and store a relationship between the address ADD and the write count value CNTw of the memory blocks.

During the write operation, the first detection block 230 may detect a hot memory block based on the number of times that the write operation is performed among the plurality of memory blocks. When the write command WT is inputted, the first detection block 230 may check the write count value CNTw of the memory block on which the write operation is performed from the counting block 210. When the write count value CNTw is equal to or higher than a first threshold value TH1, the first detection block 230 may detect the memory block on which the write operation is performed as the hot memory block. The first detection block 230 may output the address ADD of the memory block on which the write operation is performed as an address ADDh of the hot memory block.

When the hot memory block is detected, the second detection block 240 may detect first memory blocks based on the number of times that the write operation is performed among the plurality of memory blocks. When the address ADDh of the hot memory block is inputted from the first detection block 230, the second detection block 240 may check the write count values CNTw from the counting block 210, and detect memory blocks whose write count value CNTw is lower than a second threshold value TH2 as the first memory blocks.

The second detection block 240 may include a register, etc., and store an address ADDn indicating a memory block of a specific region of the memory device 120. The address ADDn may include an address of a memory block positioned adjacent to the SWD 140 and/or the BSLA 260 in the memory cell array 130. The address ADDn may include a combination of a specific row address X and a specific column address Y.

The second detection block 240 may detect a cold memory block based on the address ADD of the detected first memory blocks. The second detection block 240 may compare the address ADD of the detected first memory blocks with the address ADDn of a memory block which is designated among the plurality of memory blocks. The second detection block 240 may detect a memory block whose address ADD does not coincide with the address ADDn of the designated memory block among the detected first memory blocks as the cold memory block. The second detection block 240 may output an address ADDc of the detected cold memory block to the block-swapping block 250.

The block-swapping block 250 may swap the hot memory block and the cold memory block based on the address ADDh of the hot memory block and the address ADDc of the cold memory block, respectively. That is, the block-swapping block 250 may swap data of the hot memory block for data of the cold memory block to perform a wear-leveling operation.

In accordance with an embodiment of the present invention, the memory controller 110 may detect the hot memory block on which the write operation is performed a threshold number of times or more and the cold memory block on which the write operation is performed less than the threshold number of times, and may perform the wear-leveling operation on the detected hot and cold memory blocks. While performing the wear-leveling operation, the memory controller 110 may prevent the hot memory block from moving to a region adjacent to the driver and sense amplifying regions, thereby preventing the read disturbance phenomenon.

In some embodiments of the present invention, the counting block 210 may count the write and read operations performed on the memory device 120. The counting block 210 may perform the counting operation in response to the write/read commands WT/RD. The counting block 210 may receive the address ADD indicating memory blocks on which the write and read operations are performed.

In response to the write command WT, the counting block 210 may increase the write count value CNTw of the address ADD corresponding to the memory block on which the write operation is performed. Also, in response to the read command RD, the counting block 210 may increase a read count value CNTr of the address ADD corresponding to the memory block on which the read operation is performed.

Accordingly, the counting block 210 may generate the write count value CNTw and the read count value CNTr indicating a number of times that the write operation is performed and a number of times that the read operation is performed, respectively. The counting block 210 may include the map table 220, and store a relationship between the address ADD and the write count value CNTw and read count value CNTr of the memory blocks.

As described above, during the write operation, the first detection block 230 may detect the hot memory block. When the hot memory block is detected, the second detection block 240 may check the number of times that the read operation is performed on the detected hot memory block. In other words, when the address ADDh of the hot memory block is inputted from the first detection block 230, the second detection block 240 may check the read count value CNTr corresponding to the address ADDh of the hot memory block from the counting block 210.

When the read count value CNTr is equal to or higher than a third threshold value TH3, the second detection block 240 may detect the first memory blocks based on the number of times that the write operation is performed among the memory blocks, and detect the cold memory block based on the address ADD of the first memory blocks. Since such an operation is the same as the operation described above, detailed descriptions thereof are omitted.

When the read count value CNTr is lower than the third threshold value TH3, the second detection block 240 may detect the memory block on which the number of times that the write operation is performed is lower than the second threshold value TH2 among the memory blocks as the cold memory block. In other words, the second detection block 240 may check the write count value CNTw from the counting block 210, and detect the memory block whose write count value CNTw is lower than the second threshold value TH2 as the cold memory block.

In some embodiments of the present invention, the memory controller 110 may detect the hot memory block on which the number of times that the write operation is performed is equal to or higher than the threshold value, and check the number of times that the read operation is performed on the detected hot memory block. When the number of times that the read operation is performed is equal to or higher than the threshold value, the memory controller 110 may prevent the detected hot memory block from moving to the region adjacent to the driver and sense amplifying regions through the wear-leveling operation. When the number of times that the read operation is performed is lower than the threshold value, the memory controller 110 may move the detected hot memory block regardless of regions, thereby increasing efficiency of the wear-leveling operation.

In some embodiments of the present invention, the memory controller 110 may further include a third detection block 260.

The third detection block 260 may detect a second memory block and a third memory block based on the number of times that the read operation is performed and the address among the plurality of memory blocks. The third detection block 260 may include a register, etc., and store the address ADDn indicating the designated memory blocks of the memory device 120.

The third detection block 260 may check the read count values CNTr from the counting block 210, and detect memory blocks whose read count values CNTr are lower than the second threshold value TH2. The third detection block 260 may compare the address ADD of the detected memory blocks with the address ADDn of the designated memory blocks. The third detection block 260 may detect a memory block whose address ADD does not coincide with the address ADDn of the designated memory block among the detected memory blocks as the second memory block.

The third detection block 260 may detect a memory block on which the number of times that the read operation is performed is equal to or higher than the third threshold value TH3 among the designated memory blocks as the third memory block. In other words, the third detection block 260 may detect the memory block whose read count value CNTr is equal to or higher than the third threshold value TH3 among the designated memory blocks as the third memory block.

When the third detection block 260 outputs addresses ADD2 and ADD5 of the detected second and third memory blocks, the block-swapping block 250 may swap the second and third memory blocks. That is, the block-swapping block 250 may swap the data of the second memory block for the data of the third memory block.

In some embodiments of the present invention, the memory controller 110 may move the memory block on which the number of times that the read operation is performed is lower than the threshold value to the region adjacent to the driver and sense amplifying regions. Accordingly, the read disturbance phenomenon may be prevented from occurring due to the read operation frequently performed on the region adjacent to the driver and sense amplifying regions.

Figure 3A:
FIGS. 3A and 3B are diagrams illustrating moves of memory blocks of the memory device shown in FIG. 1.
Figure 3B:
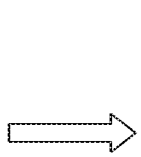

FIGS. 3A and 3B are diagrams illustrating moves of the memory blocks of the memory device 120 shown in FIG. 1. FIG. 3A shows that a wear-leveling operation is performed on detected hot and cold memory blocks, and FIG. 3B shows that a block-swapping operation is performed on detected second and third memory blocks. FIGS. 3A and 3B illustrate as an example that the memory device 120 includes 9 memory blocks.

Referring to FIG. 3A, an address (X,Y), a write count value and a read count value corresponding to each of the memory blocks are illustrated. For example, it may be seen that a write count value and a read count value of of a memory block corresponding to an address (2,2) are "50" and "500", respectively. That is, it may mean that a write operation is performed 50 times and a read operation is performed 500 times on the memory block corresponding to the address (2,2).

Also, a memory block corresponding to an address (0,0) may represent a memory block adjacent to both of the SWD 140 and the BLSA 150 shown in FIG. 1. That is, the address (0,0) may represent the address ADDn of the designated memory block among the plurality of memory blocks, and be stored in the second detection block 240.

A relationship between the address (X,Y), the write count value and the read count value may be stored in the map table 220 of the counting block 210. The first detection block 230 and the second detection block 240 may check the map table 220 to detect the hot memory block and the cold memory block. It may be assumed that the first threshold value TH1, the second threshold value TH2 and the third threshold value TH3 are 100, 30 and 1000, respectively.

When the write operation is performed on any one of the 9 memory blocks shown on a left side of FIG. 3A, for example, a middle memory block (1,1), the counting block 210 may increase "1" from a corresponding write count value 99. Accordingly, the write count value 100 of the middle memory block (1,1) may be equal to or higher than the first threshold value TH1, and the first detection block 230 may detect the middle memory block (1,1) as the hot memory block.

In accordance with an embodiment of the present invention, when the hot memory block (1,1) is detected, the second detection block 240 may check write count values of the 9 memory blocks and detect memory blocks (2,1) and (0,0) whose write count values are lower than the second threshold value TH2 as first memory blocks. The memory block (2,1) whose address does not coincide with the address (0,0) of the designated memory block among the detected first memory blocks (2,1) and (0,0) may be detected as the cold memory block.

The block-swapping block 250 may swap the hot memory block (1,1) for the cold memory block (2,1). A right side of FIG. 3A shows the 9 memory blocks on which the wear-leveling operation is completed. In accordance with an embodiment of the present invention, although the write count value 10 of the designated memory block (0,0) is small, the designated memory block (0,0) may be excluded from being detected as the cold memory block. Accordingly, it is possible to prevent the hot memory block (1,1) from being moved to the designated memory block (0,0) to cause the read disturbance phenomenon.

In some embodiments of the present invention, when the hot memory block (1,1) is detected, the second detection block 240 may check the read count value 1000 of the hot memory block (1,1). Since the read count value 1000 is equal to or higher than the third threshold value TH3, the second detection block 240 may detect the cold memory block (2,1) in the manner described above, and the cold memory block (2,1) may be swapped for the hot memory block (1,1).

When the read count value 1000 is lower than the third threshold value TH3, the second detection block 240 may detect the designated memory block (0,0) as the cold memory block (2,1), and the cold memory block (0,0) may be swapped for the hot memory block (1,1). That is, since the read operation is not performed on the hot memory block (1,1) many times, the wear-leveling operation may be performed regardless of the read disturbance phenomenon.

Referring to FIG. 3B, an address (X,Y) and a read count value corresponding to each of the memory blocks are illustrated. Differently from FIG. 3A, memory blocks corresponding to addresses (0,0), (1,0) and (0,1) may be included in the designated memory blocks, and the third threshold value TH3 may be set to "100".

The third detection block 260 may check read count values of the 9 memory blocks on a left side of FIG. 3B and detect memory blocks (1,1) and (1,0) whose read count values are lower than the second threshold value TH2. The memory block (1,1) whose address does not coincide with the addresses (0,0), (1,0) and (0,1) of the designated memory blocks among the detected memory blocks (1,1) and (1,0) may be detected as the second memory block.

In addition, the third detection block 260 may detect the memory block (0,0) whose read count value is equal to or higher than the third threshold value TH3 among the designated memory blocks (0,0), (1,0) and (0,1) as the third memory block. Accordingly, the block-swapping block 250 may swap the second memory block (1,1) for the third memory block (0,0). A right side of FIG. 3B shows the 9 memory blocks on which the block-swapping operation is completed.

In accordance with an embodiment of the present invention, the memory controller 110 may detect the second memory block (1,1) having a low read count value 10 among the plurality of memory blocks, and detect the third memory block (0,0) having a high read count value 100 among the designated memory blocks (0,0), (1,0) and (0,1). Accordingly, the second memory block (1,1) on which the read operation is performed a small number of times is swapped for the third memory block (0,0) on which the read operation is performed many times among the designated memory blocks, whereby the read disturbance phenomenon may be prevented from occurring.

Figure 4:
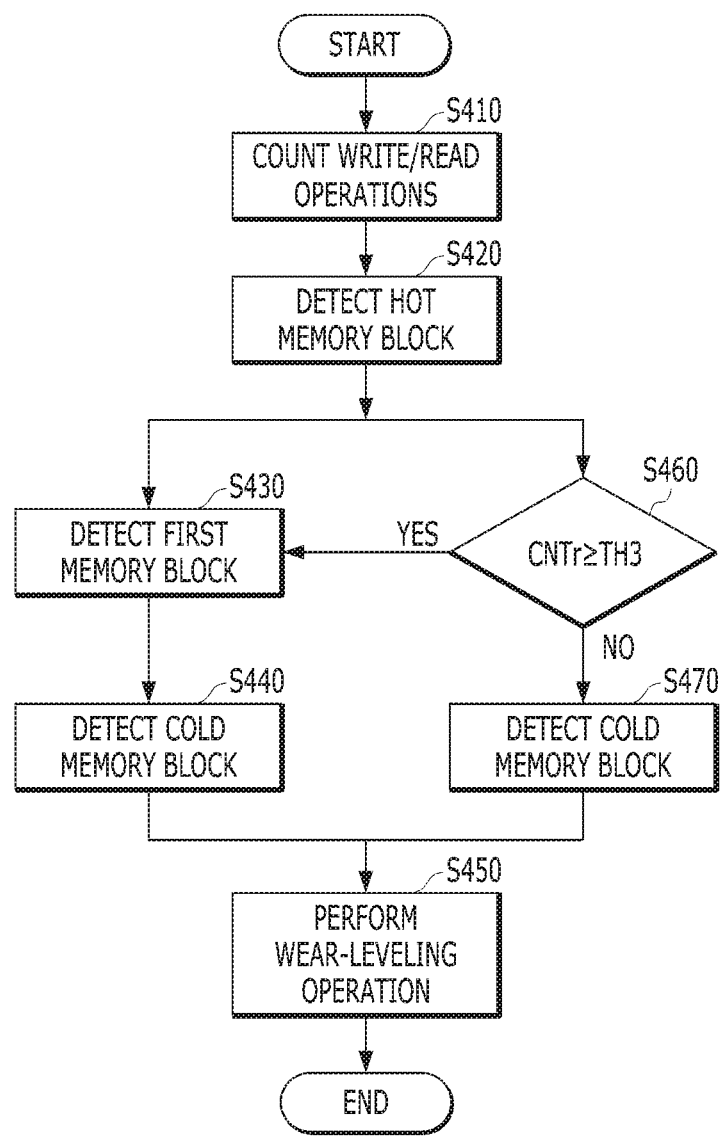
FIG. 4 is a flowchart illustrating an operation of a memory system in accordance with an embodiment of the present invention.

FIG. 4 is a flowchart illustrating an operation of a memory system in accordance with an embodiment of the present invention.

In step S410, the counting block 210 may count the write operation and read operation performed on the memory device 120. The counting block 210 may increase the write count value CNTw of the address ADD corresponding to the memory block on which the write operation is performed in response to the write command WT, and increase the read count value CNTr of the address ADD corresponding to the memory block on which the read operation is performed in response to the read command RD. The counting block 210 may store a relationship between the addresses ADD and the write count values CNTw and read count values CNTr of the memory blocks in the map table 220.

In step S420, the first detection block 230 may detect the hot memory block based on the number of times that the write operation is performed among the memory blocks during the write operation. In other words, when the write command WT is inputted, the first detection block 230 may check the write count value CNTw of the memory block on which the write operation is performed from the counting block 210, and compare the write count value CNTw with the first threshold value TH1. When the write count value CNTw is equal to or higher than the first threshold value TH1, the first detection block 230 may detect the memory block on which the write operation is performed as the hot memory block. The first threshold value TH1 may be the number of times that the write operation is repeatedly performed to the extent that characteristics related to durability are not degraded, such as a retention time of a memory cell.

When the first detection block 230 detects the hot memory block, the second detection block 240 may detect the first memory blocks based on the number of times that the write operation is performed among the memory blocks in step S430. When the address ADDh of the hot memory block is inputted from the first detection block 230, the second detection block 240 may check the write count values CNTw from the counting block 210, and detect the memory blocks whose write count values CNTw are lower than the second threshold value TH2 as the first memory blocks. The second threshold value TH2 may be the number of accesses of data that is not frequently used from the host.

In step S440, the second detection block 240 may detect the cold memory block based on the addresses ADD of the first memory blocks. The second detection block 240 may compare the addresses ADD of the first memory blocks with the address ADDn of the designated memory block among the memory blocks. The second detection block 240 may detect the memory block whose address ADD does not coincide with the address ADDn of the designated memory block among the first memory blocks as the cold memory block.

In step S450, the block-swapping block 250 may swap the data of the hot memory block for the data of the cold memory block. The block-swapping block 250 may swap the hot memory block for the cold memory block based on the address ADDh of the hot memory block and the address ADDc of the cold memory block.

In some embodiments of the present invention, when the first detection block 230 detects the hot memory block, the second detection block 240 may check the number of times that the read operation is performed on the hot memory block in step S460. In other words, when the address ADDh of the hot memory block is inputted from the first detection block 230, the second detection block 240 may check the read count value CNTr corresponding to the address ADDh of the hot memory block from the counting block 210, and compare the read count value CNTr with the third threshold value TH3.

When the read count value CNTr is equal to or higher than the third threshold value TH3 (that is, "YES" in step S460), the step S430 may be carried out. Subsequently, the steps S440 and S450 may be carried out as described above. The third threshold value TH3 may be the number of times that the read operation is repeatedly performed, which may cause the read disturbance phenomenon.

When the read count value CNTr is lower than the third threshold value TH3 (that is, "NO" in step S460), the second detection block 240 may detect the cold memory block in step S470. In other words, the second detection block 240 may detect the memory block on which the number of times that the write operation is performed is lower than the second threshold value TH2 as the cold memory block. Subsequently, the step S450 may be carried out as described above.

Figure 5:
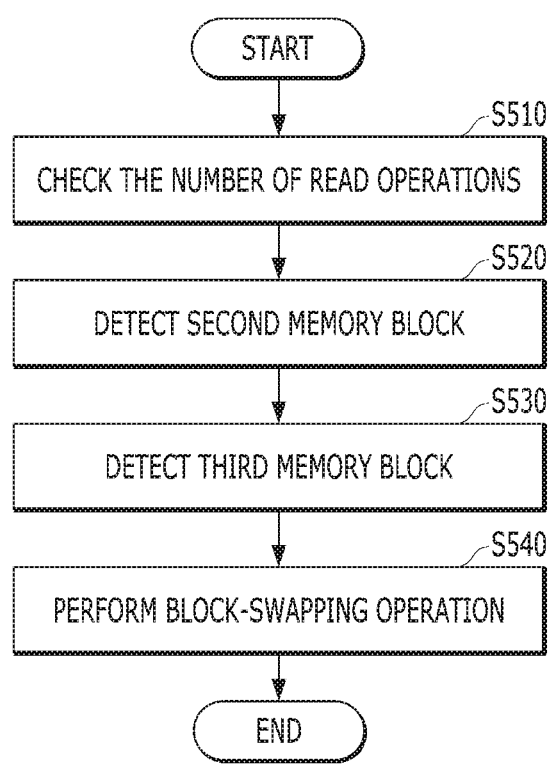
FIG. 5 is a flowchart illustrating an operation of a memory system in accordance with an embodiment of the present invention.

FIG. 5 is a flowchart illustrating an operation of a memory system in accordance with an embodiment of the present invention.

In step S510, the counting block 210 may count the read operation performed on the memory device 120. The counting block 210 may store a relationship between the addresses ADD and the read count values CNTr of the memory blocks in the map table 220. The third detection block 260 may check the number of times that the read operation is performed on the memory blocks. The third detection block 260 may check the read count values CNTr from the counting block 210.

In step S520, the third detection block 260 may detect the memory blocks on which the number of times that the read operation is performed is lower than the second threshold value TH2 among the memory blocks. In other words, the third detection block 260 may detect the memory blocks whose read count values CNTr are lower than the second threshold value TH2 among the memory blocks. The second threshold value TH2 may be the number of accesses of data that is not frequently used from the host.

The third detection block 260 may detect the second memory block based on the addresses ADD of the memory blocks. The third detection block 260 may compare the addresses ADD of the memory blocks with the addresses ADDn of the designated memory blocks among the memory blocks. The third detection block 260 may detect the memory block whose address ADD does not coincide with the addresses ADDn of the designated memory blocks among the detected memory blocks as the second memory block.

In step S530, the third detection block 260 may detect the memory block on which the number of times that the read operation is performed is equal to or higher than the third threshold value TH3 among the designated memory block as the third memory block. The third detection block 260 may detect the memory block whose read count value CNTr is equal to or higher than the third threshold value TH3 among the designated memory blocks as the third memory block based on the addresses ADDn of the designated memory blocks. The third threshold value TH3 may be equal to or lower than the number of times that the read operation is repeatedly performed, which may cause the read disturbance phenomenon as described above.

In step S540, the block-swapping block 250 may swap the data of the second memory block for the data of the third memory block. The block-swapping block 250 may swap the second memory block for the third memory block based on the addresses ADD2 and ADD3 of the second and third memory blocks inputted from the third detection block 260.

In accordance with embodiments of the present invention, as hot and cold memory blocks of the memory device are detected and swapped based on a number of times that the write operation is performed, it may prevent the hot memory block from moving to a specific region of the memory device. Accordingly, the read disturbance phenomenon may be prevented from occurring due to the hot memory block. Considering the number of times that the write operation is performed, it may be selectively determined that the hot memory block is moved to the specific region. Consequently, efficiency of the wear-leveling operation may increase.

In addition, the cold memory block may be arranged in a specific region of the memory device based on a number of times that the read operation is performed. Accordingly, during the read operation, a rate of bit errors and a number of times that the ECC operation or the scrubbing operation is performed may be reduced.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Also, dispositions and types of the logic gates and transistors described in the aforementioned embodiments may be implemented differently based on the polarity of the inputted signal.

What is claimed is:

1. A memory system, comprising:
a memory device including a plurality of memory blocks;
a first detection block suitable for detecting a hot memory block based on a number of times that a write operation is performed among the memory blocks during the write operation;
a second detection block suitable for detecting first memory blocks based on the number of times that the write operation is performed among the memory blocks and detecting, among the first memory blocks, a cold memory block having an address different from an address of a designated memory block among the memory blocks, when the hot memory block is detected; and
a wear-leveling block suitable for swapping data of the hot memory block for data of the cold memory block.

2. The memory system of claim 1, wherein the first detection block detects a memory block on which the write operation is performed as the hot memory block when the number of times that the write operation is performed on the memory block is equal to or greater than a first threshold value.

3. The memory system of claim 1, wherein when the hot memory block is detected, the second detection block detects memory blocks on which the number of times that the write operation is performed is smaller than a second threshold value as the first memory blocks.

4. The memory system of claim 1, wherein the second detection block compares the addresses of the first memory blocks with the address of the designated memory block among the memory blocks, and detects a memory block having an address different from the address of the designated memory block among the first memory blocks as the cold memory block.

5. The memory system of claim 4, wherein the designated memory block among the memory blocks includes a memory block adjacent to a word line driver region or a bit line sense amplifying region.

6. The memory system of claim 1, wherein when the hot memory block is detected, the second detection block checks a number of times that a read operation is performed on the hot memory block, and detects the first memory blocks and the cold memory block when the number of times that the read operation is performed is equal to or greater than a third threshold value.

7. The memory system of claim 6, wherein when the number of times that the read operation is performed is smaller than the third threshold value, the second detection block detects a memory block on which the number of times that the write operation is performed is smaller than a second threshold value among the memory blocks as the cold memory block.

8. The memory system of claim 1, further comprising:
a third detection block suitable for detecting a second memory block and a third memory block based on a number of times that a read operation is performed and an address among the memory blocks; and
a block-swapping block suitable for swapping data of the second memory block for data of the third memory block.

9. The memory system of claim 8, wherein the third detection block detects memory blocks on which the number of times that the read operation is performed is smaller than a second threshold value among the memory blocks, and detects a memory block, among the detected memory blocks, having an address different from addresses of designated memory blocks among the memory blocks as the second memory block.

10. The memory system of claim 9, wherein the third detection block detects a memory block on which the number of times that the read operation is performed is equal to or greater than a third threshold value among the designated memory blocks as the third memory block.

11. The memory system of claim 1, further comprising:
a counting block suitable for counting the write operation and a read operation in response to write and read commands to generate a write count value and a read count value indicating the number of times that the write operation is performed and a number of times that the read operation is performed on the memory blocks.

12. An operating method for a memory system, comprising:
detecting a hot memory block based on a number of times that a write operation is performed among a plurality of memory blocks during the write operation;
detecting first memory blocks based on the number of times that the write operation is performed among the memory blocks when the hot memory blocks is detected;
detecting, among the first memory blocks, a cold memory block having an address different from an address of a designated memory block among the memory blocks; and
swapping data of the hot memory block for data of the cold memory block.

13. The operating method of claim 12, wherein the detecting of the hot memory block includes:
comparing the number of times that the write operation is performed on a memory block with a first threshold value; and
detecting the memory block on which the write operation is performed as the hot memory block when the number of times that the write operation is performed is equal to or greater than the first threshold value.

14. The operating method of claim 12, wherein the detecting of the first memory blocks includes:
detecting memory blocks on which the number of times that the write operation is performed is smaller than a second threshold value among the memory blocks, as the first memory blocks.

15. The operating method of claim 12, wherein the detecting of the cold memory block includes:
comparing the addresses of the first memory blocks with the address of the designated memory block among the plurality of memory blocks; and
detecting a memory block having an address different from the address of the designated memory block among the first memory blocks as the cold memory block.

16. The operating method of claim 15, wherein the designated memory block among the plurality of memory blocks includes a memory block adjacent to a word line driver region or a bit line sense amplifying region.

17. The operating method of claim 12, further comprising:
comparing a number of times that a read operation is performed on the hot memory block with a third threshold value when the hot memory block is detected,
wherein the first memory blocks are detected when the number of times that the read operation is performed is equal to or greater than the third threshold value.

18. The operating method of claim 17, wherein when the number of times that the read operation is performed is smaller than the third threshold value, a memory block on which the number of times that the write operation is performed is smaller than a second threshold value among the memory blocks as the cold memory block.

19. An operating method for a memory system, comprising:
checking a number of times that a read operation is performed on a plurality of memory blocks;
detecting memory blocks on which the number of times that the read operation is performed is smaller than a second threshold value among the plurality of memory blocks;
detecting a memory block, among the detected memory blocks, having an address different from addresses of designated memory blocks among the plurality of memory blocks as a second memory block;
detecting a memory block on which the number of times that the read operation is performed is equal to or greater than a third threshold value among the designated memory blocks as a third memory block; and
swapping data of the second memory block for data of the third memory block.

20. The operating method of claim 19, wherein the designated memory blocks among the plurality of memory blocks include memory blocks adjacent to a word line driver region or a bit line sense amplifying region.

* * * * *